United States Patent
Zeng et al.

(10) Patent No.: US 8,626,516 B2
(45) Date of Patent: Jan. 7, 2014

(54) METHOD AND SYSTEM FOR DYNAMIC RANGE CONTROL IN AN AUDIO PROCESSING SYSTEM

(75) Inventors: Hanks Zeng, Red Bank, NJ (US); Prakash Khanduri, Freehold, NJ (US); Ken Kasiske, Jackson, NJ (US); Ronish Patel, Manalapan, NJ (US); Nelson Sollenberger, Farmingdale, NJ (US)

(73) Assignee: Broadcom Corporation, Irvine, CA (US)

( * ) Notice: Subject to any disclaimer, the term of this patent is extended or adjusted under 35 U.S.C. 154(b) by 1338 days.

(21) Appl. No.: 12/367,854

(22) Filed: Feb. 9, 2009

(65) Prior Publication Data

US 2010/0204996 A1 Aug. 12, 2010

(51) Int. Cl.
*G10L 19/00* (2013.01)
*G10L 21/00* (2013.01)

(52) U.S. Cl.
USPC ............ 704/500; 704/501; 704/502; 704/205

(58) Field of Classification Search
USPC ......................................... 704/500–504, 205
See application file for complete search history.

(56) References Cited

U.S. PATENT DOCUMENTS

| | | | | |
|---|---|---|---|---|
| 4,905,291 A | * | 2/1990 | Strickland | 381/108 |
| 5,893,068 A | * | 4/1999 | Hasegawa | 704/502 |
| 5,926,791 A | * | 7/1999 | Ogata et al. | 704/500 |
| 7,013,274 B2 | * | 3/2006 | Brandman | 704/243 |
| 7,065,485 B1 | * | 6/2006 | Chong-White et al. | 704/208 |
| 7,205,910 B2 | * | 4/2007 | Honma et al. | 341/50 |
| 7,941,319 B2 | * | 5/2011 | Nomura et al. | 704/500 |
| 2002/0126861 A1 | * | 9/2002 | Colby | 381/106 |
| 2003/0112088 A1 | * | 6/2003 | Bizjak | 333/14 |
| 2003/0161477 A1 | * | 8/2003 | Wu et al. | 381/2 |
| 2004/0024588 A1 | * | 2/2004 | Watson et al. | 704/200.1 |
| 2004/0083110 A1 | * | 4/2004 | Wang | 704/500 |

(Continued)

FOREIGN PATENT DOCUMENTS

| | | |
|---|---|---|
| CN | 1620751 | 5/2005 |
| CN | 1627635 | 6/2005 |

(Continued)

OTHER PUBLICATIONS

European Patent Office, Communication with European Search Report, in EP10000816.8, dated May 12, 2010.

*Primary Examiner* — Michael N Opsasnick
*Assistant Examiner* — Abdelali Serrou
(74) *Attorney, Agent, or Firm* — Sterne, Kessler, Goldstein & Fox, P.L.L.C.

(57) ABSTRACT

Methods and systems for dynamic range control in an audio processing system are disclosed and may include controlling a dynamic range of an audio signal by expanding the dynamic range utilizing a dynamic expander, and dividing the audio signal into a plurality of frequency bands. Each of the bands may be individually compressed utilizing a multi-band compressor. A sum of the individually compressed frequency bands may be compressed utilizing a full-band compressor. The audio signal may be filtered utilizing a pre-emphasis filter, such as an infinite impulse response filter and may be divided into frequency bands utilizing one or more finite impulse response filters and/or delay modules. The dynamic expander may include adaptive thresholds and an envelope detector. Each of the frequency bands may be compressed utilizing syllabic compression in the multi-band compressor. The compressed sum of compressed plurality of bands may be processed utilizing an audio CODEC.

25 Claims, 8 Drawing Sheets

(56) References Cited

U.S. PATENT DOCUMENTS

| | | | |
|---|---|---|---|
| 2004/0158460 A1* | 8/2004 | Finn et al. | 704/205 |
| 2004/0252850 A1* | 12/2004 | Turicchia et al. | 381/94.2 |
| 2005/0249272 A1* | 11/2005 | Kirkeby et al. | 375/232 |
| 2006/0247922 A1* | 11/2006 | Hetherington et al. | 704/208 |
| 2007/0299655 A1* | 12/2007 | Laaksonen et al. | 704/205 |
| 2008/0080722 A1* | 4/2008 | Carroll et al. | 381/109 |
| 2009/0271186 A1* | 10/2009 | Leblanc et al. | 704/226 |
| 2010/0169105 A1* | 7/2010 | Shim | 704/503 |

FOREIGN PATENT DOCUMENTS

| | | |
|---|---|---|
| EP | 1542359 A1 | 6/2005 |
| WO | WO02/15395 A1 | 2/2002 |
| WO | WO2009/110087 A1 | 9/2009 |

* cited by examiner

METHOD AND SYSTEM FOR DYNAMIC RANGE CONTROL IN AN AUDIO PROCESSING SYSTEM

CROSS-REFERENCE TO RELATED APPLICATIONS/INCORPORATION BY REFERENCE

This application makes reference to:
U.S. patent application Ser. No. 12/474,061 filed on May 28, 2009; and
U.S. patent application Ser. No. 12/474,065 filed on May 28, 2009.

Each of the above stated applications is hereby incorporated by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing of audio signals. More specifically, certain embodiments of the invention relate to a method and system for dynamic range control in an audio processing system.

BACKGROUND OF THE INVENTION

In audio applications, systems that provide audio interface and processing capabilities may be required to support duplex operations, which may comprise the ability to collect audio information through a sensor, microphone, or other type of input device while at the same time being able to drive a speaker, earpiece of other type of output device with processed audio signal. In order to carry out these operations, these systems may utilize audio coding and decoding (codec) devices that provide appropriate gain, filtering, and/or analog-to-digital conversion in the uplink direction to circuitry and/or software that provides audio processing and may also provide appropriate gain, filtering, and/or digital-to-analog conversion in the downlink direction to the output devices.

As audio applications expand, such as new voice and/or audio compression techniques and formats, for example, and as they become embedded into wireless systems, such as mobile phones, for example, novel codec devices may be needed that may provide appropriate processing capabilities to handle the wide range of audio signals and audio signal sources. In this regard, added functionalities and/or capabilities may also be needed to provide users with the flexibilities that new communication and multimedia technologies provide. Moreover, these added functionalities and/or capabilities may need to be implemented in an efficient and flexible manner given the complexity in operational requirements, communication technologies, and the wide range of audio signal sources that may be supported by mobile phones.

The audio inputs to mobile phones may come from a variety of sources, at a number of different sampling rates, and audio quality. Polyphonic ringers, voice, and high quality audio, such as music, are sources that are typically processed in a mobile phone system. The different quality of the audio source places different requirements on the processing circuitry, thus dictating flexibility in the audio processing systems.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for dynamic range control in an audio processing system, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for dynamic range control in an audio processing system. Exemplary aspects of the invention may comprise controlling a dynamic range of an audio signal by expanding the dynamic range utilizing a dynamic expander, and dividing the audio signal into a plurality of frequency bands. Each of the frequency bands may be individually compressed utilizing a multi-band compressor. A sum of the individually compressed frequency bands may be compressed utilizing a full-band compressor. The audio signal may be filtered utilizing a pre-emphasis filter, such as an infinite impulse response filter. The audio signal may be divided into a plurality of frequency bands utilizing one or more finite impulse response filters and/or delay modules. The dynamic expander may comprise adaptive thresholds and an envelope detector. Each of the plurality of frequency bands may be compressed utilizing syllabic compression in the multi-band compressor. The compressed sum of the individually compressed plurality of frequency bands may be processed utilizing an audio CODEC. The multi-band compressor may comprise a plurality of sub-band compressors.

Figure 1:
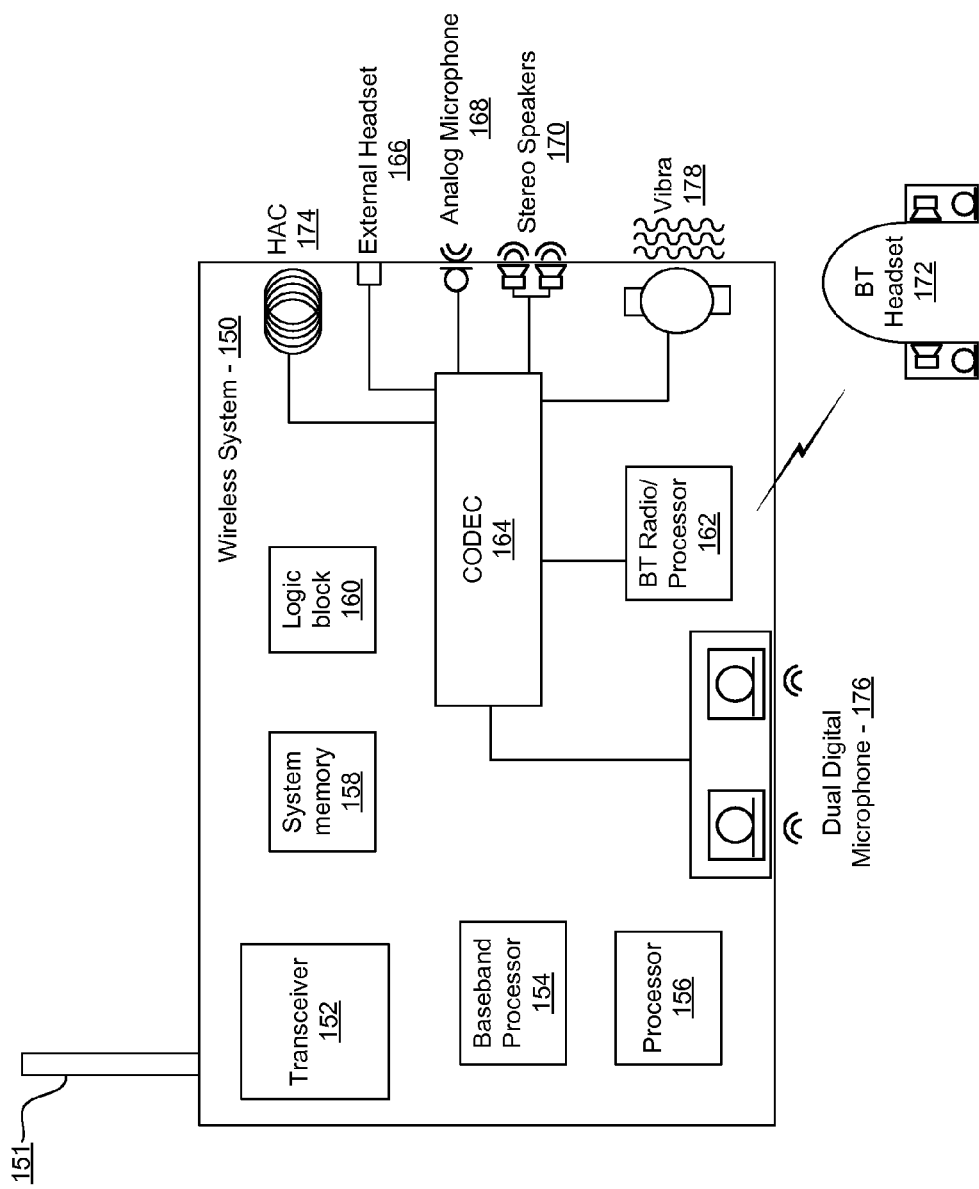
FIG. 1 is a module diagram of an exemplary wireless system, which may be utilized in accordance with an embodiment of the invention.

FIG. 1 is a module diagram of an exemplary wireless system, which may be utilized in accordance with an embodiment of the invention. Referring to FIG. 1, the wireless system 150 may comprise an antenna 151, a transceiver 152, a baseband processor 154, a processor 156, a system memory 158, a logic module 160, a Bluetooth radio/processor 162, a CODEC 164, an external headset port 166, an analog microphone 168, stereo speakers 170, a Bluetooth headset 172, a hearing aid compatible (HAC) coil 174, a dual digital microphone 176, and a vibration transducer 178. The antenna 151 may be used for reception and/or transmission of RF signals.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality transceivers, transmitters and/or receivers. In this regard, the plurality of transceivers, transmitters and/or receivers may enable the wireless system 150 to handle a plurality of wireless protocols and/or standards including cellular, WLAN and PAN.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic module 160 may comprise suitable logic, circuitry, and/or code that may enable controlling of various functionalities of the wireless system 150. For example, the logic module 160 may comprise one or more state machines that may generate signals to control the transceiver 152 and/or the baseband processor 154. The logic module 160 may also comprise registers that may hold data for controlling, for example, the transceiver 152 and/or the baseband processor 154. The logic module 160 may also generate and/or store status information that may be read by, for example, the processor 156. Amplifier gains and/or filtering characteristics, for example, may be controlled by the logic module 160.

The BT radio/processor 162 may comprise suitable circuitry, logic, and/or code that may enable transmission and reception of Bluetooth signals. The BT radio/processor 162 may enable processing and/or handling of BT baseband signals. In this regard, the BT radio/processor 162 may process or handle BT signals received and/or BT signals transmitted via a wireless communication medium. The BT radio/processor 162 may also provide control and/or feedback information to/from the baseband processor 154 and/or the processor 156, based on information from the processed BT signals. The BT radio/processor 162 may communicate information and/or data from the processed BT signals to the processor 156 and/or to the system memory 158. Moreover, BT radio/processor 162 may receive information from the processor 156 and/or the system memory 158, which may be processed and transmitted via the wireless communication medium.

The CODEC 164 may comprise suitable circuitry, logic, and/or code that may process audio signals received from and/or communicated to input/output devices. The input devices may be within or communicatively coupled to the wireless device 150, and may comprise the analog microphone 168, the stereo speakers 170, the Bluetooth headset 172, the hearing aid compatible (HAC) coil 174, the dual digital microphone 176, and the vibration transducer 178, for example. The CODEC 164 may be operable to up-convert and/or down-convert signal frequencies to desired frequencies for processing and/or transmission via an output device. The CODEC 164 may enable utilizing a plurality of digital audio inputs, such as 16 or 18-bit inputs, for example. The CODEC 164 may also enable utilizing a plurality of data sampling rate inputs. For example, the CODEC 164 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 164 may also support mixing of a plurality of audio sources. For example, the CODEC 164 may support audio sources such as general audio, polyphonic ringer, I2S FM audio, vibration driving signals, and voice. In this regard, the general audio and polyphonic ringer sources may support the plurality of sampling rates that the audio CODEC 164 is enabled to accept, while the voice source may support a portion of the plurality of sampling rates, such as 8 kHz and 16 kHz, for example.

The audio CODEC 164 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, filter coefficients may be switched in one-shot or may be switched sequentially, for example. The CODEC 164 may also utilize a modulator, such as a Delta-Sigma (Δ-Σ) modulator, for example, to code digital output signals for analog processing.

The external headset port 166 may comprise a physical connection for an external headset to be communicatively coupled to the wireless system 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The stereo speakers 170 may comprise a pair of speakers that may be operable to generate audio signals from electrical signals received from the CODEC 164. The Bluetooth headset 172 may comprise a wireless headset that may be communicatively coupled to the wireless system 150 via the Bluetooth radio/processor 162. In this manner, the wireless system 150 may be operated in a hands-free mode, for example.

The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, and/or code that may be operable to detect sound waves and convert them to electrical signals. The electrical signals generated by the dual digital microphone 176 may comprise digital signals, and thus may not require analog to digital conversion prior to digital processing in the CODEC 164. The dual digital microphone 176 may enable beamforming capabilities, for example.

The vibration transducer 178 may comprise suitable circuitry, logic, and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 164 in the wireless system 150 may communicate with the processor 156 in order to transfer audio data and control signals. Control registers for the CODEC 164 may reside within the processor 156. The processor 156 may exchange audio signals and control information via the system memory 158. The CODEC 164 may up-convert and/or down-convert the frequencies of multiple audio sources for processing at a desired sampling rate.

The wireless system 150 may comprise dynamic range control to optimize audio quality and effective loudness of an audible output signal. The dynamic range control may utilize hardware in the CODEC 164 and the BT radio/processor 162, and processing capability in the processor 156 and/or the baseband processor 154.

Figure 2:
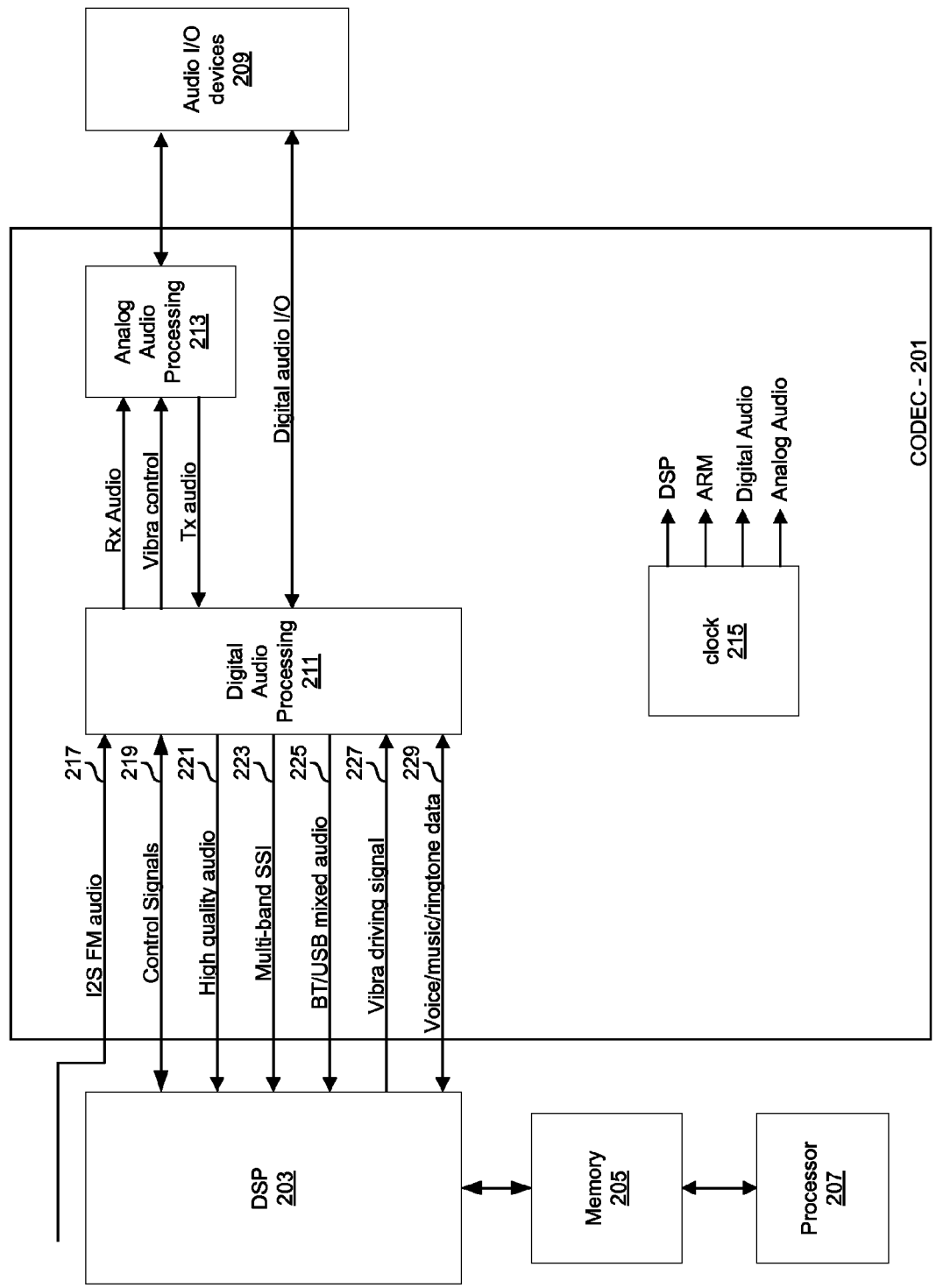
FIG. 2 is a module diagram illustrating an exemplary audio CODEC interconnection, in accordance with an embodiment of the invention.

FIG. 2 is a module diagram illustrating an exemplary audio CODEC interconnection, in accordance with an embodiment of the invention. Referring to FIG. 2, there is shown a CODEC 201, a digital signal processor (DSP) 203, a memory 205, a processor 207, and an audio I/O devices module 209. There is also shown input and output signals for the digital audio processing module 211 comprising an I$^2$S FM audio signal, control signals 219, voice/audio signal 221, a multi-band SSI signal 223, a mixed audio signal 225, a vibration driving signal 227, and a voice/music/ringtone data signal 229. The memory 205 may be substantially to the system memory 158. In another embodiment of the invention, the memory 205 may comprise a separate memory from the system memory 158.

The CODEC 201 may be substantially similar to the CODEC 164 described with respect to FIG. 1, and may comprise a digital audio processing module 211, an analog audio processing module 213, and a clock 215. The digital audio processing module 211 may comprise suitable circuitry, logic, and/or code that may be operable to process received digital audio signals for subsequent storage and/or communication to an output device. The digital audio processing module 211 may comprise digital filters, such as decimation and infinite impulse response (IIR) filters, for example. The analog audio processing module 213 may comprise suitable circuitry, logic, and/or code that may be operable to process received analog signals for communication to the audio I/O devices module 209 and/or the digital audio processing module 211. The analog audio processing module 213 may enable conversion of analog signals to digital signals and may filter received signals before processing, for example. In addition, the analog audio processing module 213 may provide amplification of received audio signals.

The clock 215 may comprise suitable circuitry, logic, and/or code that may generate a common clock signal that may be utilized by the DSP 203, the processor 207, the digital audio processing module 211, and the analog audio processing module 213. In this manner, the synchronization of multiple audio signals during processing, transmission, and/or playback may be enabled.

The DSP 203 may comprise suitable circuitry, logic, and/or code that may process signals received from the digital audio processing module 211 and/or retrieved from the memory 205. The DSP 203 may also store processed data in the memory 205 or communicate processed data to the digital audio processing module 211. In an embodiment of the invention, the DSP 203 may be integrated on-chip with the CODEC 211.

The processor 207 may comprise suitable circuitry, logic, and/or code that may be operable to perform routine processor functions with, for example, minimal power requirements. In one embodiment of the invention, the processor 207 may comprise an advanced RISC machine processor. Notwithstanding, the invention is not so limited, and other types of processor may be utilized. The processor 207 may be communicatively coupled with the memory 205, and may be operable to store data on and/or retrieve data from the memory 205. The processor 207 may also be operable to communicate data and/or control information between the DSP 203 and/or memory 205 to enable for more signal processing tasks by the DSP 203. For example, the processor 207 may communicate with the DSP to enable signal processing of audio signals.

In operation, the CODEC 201 may communicate with the DSP 203 in order to transfer audio data and control signals, with the exception of FM radio listening and recording, where digital FM samples may be read from an I2S directly off a Bluetooth FM receiver, such as the Bluetooth radio/processor described, with respect to FIG. 1. Control registers for the CODEC 201 may, for example, reside in the DSP 203. For voice data, audio samples may not be buffered between the DSP 203 and the CODEC 201. For music and ring-tone, audio data from the DSP 203 may be written into a FIFO, for example, within the CODEC 201 which may then fetch the data samples. A similar method may be utilized for the high quality audio 221, which may sample at 48 KHz, for example. Audio data passing between the DSP 203 and the CODEC 201 may be accomplished via interrupts. These interrupts may comprise interrupts for voice/music/ring-tone data 229, the mixed audio signal 225 at 44.1 KHz/48 KHz for Bluetooth/USB, high quality audio 221 at 48 KHz, and for the vibration driving signal 227. Interrupts may be shared between different inputs and outputs.

The audio sample data for the voice/music/ringtone data 229 in the audio receive path and the high quality audio 221 in the audio transmit path may comprise 18 bit width per sample, for example. In instances where 16-bit audio data may be present, the same 18-bit format may be used, with the two least significant bits (LSBs) zeroed, for example.

In an embodiment of the invention, the DSP 203 and the processor 207 may exchange audio data and control information via a shared memory, for example, memory 205. The processor 207 may write pulse-code modulated (PCM) audio directly into the memory 205, and may also pass coded audio data to the DSP 203 for computationally intensive processing. In this instance, the DSP 203 may decode the data and write the PCM audio back into the memory 205 for the processor 207 to access or to be delivered to the CODEC 201. The processor 207 may communicate with the CODEC 201 via the DSP 203.

In an exemplary embodiment of the invention, the CODEC 201 may be utilized to enable dynamic range control to optimize audio quality and effective loudness of an audible output signal. The dynamic range control may utilize hardware in the CODEC 201 and audio I/O devices 209, and processing capability in the DSP 203 and/or the processor 207, for example.

Figure 3:
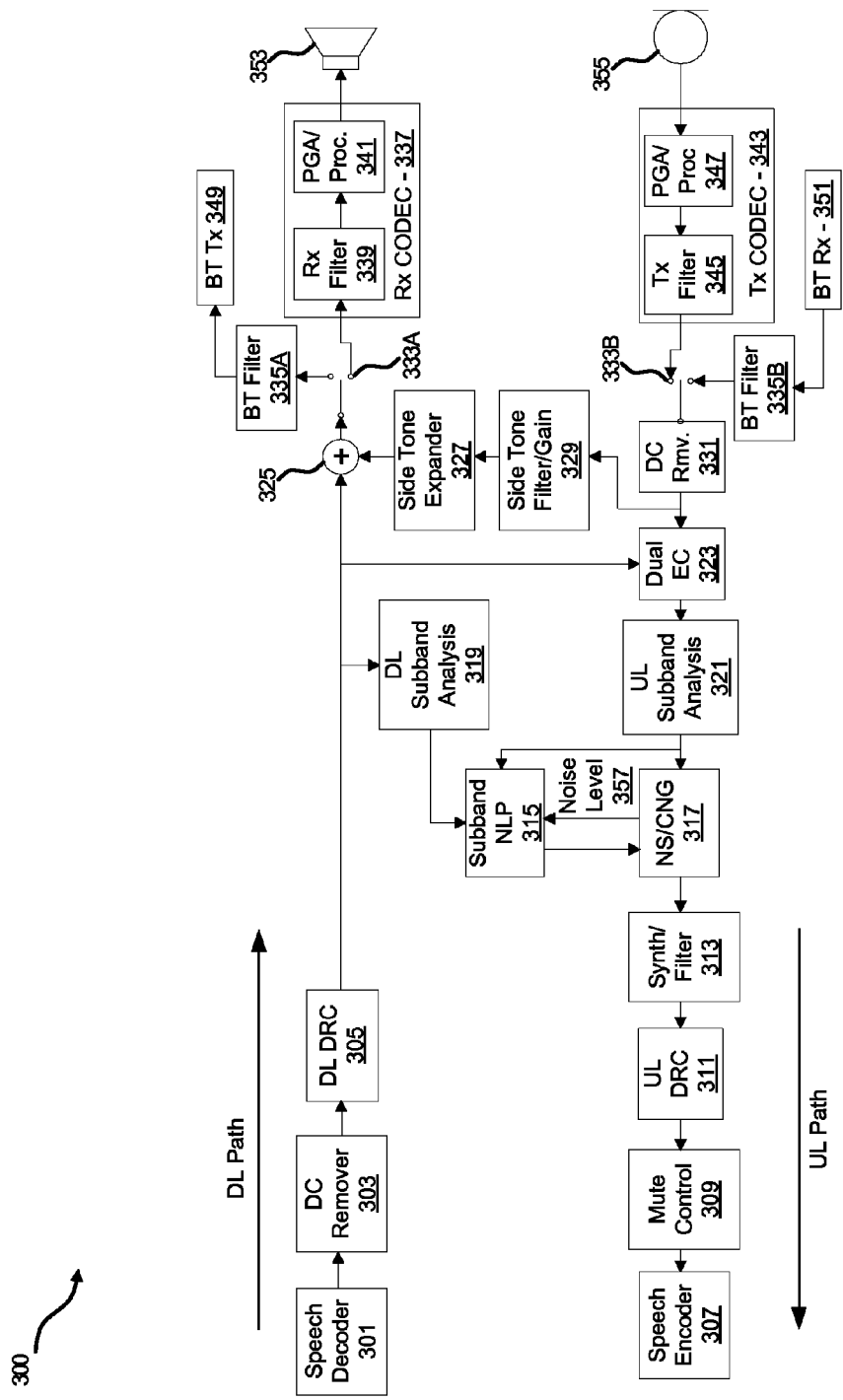
FIG. 3 is a module diagram of an exemplary audio system in accordance with an embodiment of the invention.

FIG. 3 is a module diagram of an exemplary audio system architecture in accordance with an embodiment of the invention. Referring to FIG. 3, there is shown an audio system architecture 300 comprising a speech decoder 301, DC remover module 303, a download dynamic range controller (DL DRC) 305, a speech encoder 307, a mute control 309, an upload dynamic range controller (UL DRC) 311, and a synthesis/filter module 313. FIG. 3 also shows a subband non-linear processor (NLP) 315, a noise suppressor/comfort noise generator (NS/CNG) 317, a DL subband analysis module 319, an UL subband analysis module 321, a dual echo canceller (EC) 323, an adder 325, a side tone expander 327, a side tone filter/gain module 329, a DC remover 331, and switches 333A and 333B. Additionally, FIG. 3 shows Bluetooth (BT) filters 335A and 335B, an Rx CODEC 337, a Tx filter 339, a Tx PGA/processing module 341, a Tx CODEC 343, an Rx filter 345, a Tx PGA/processing module 347, a BT Tx 349, a BT Rx 351, a speaker 353, and a microphone 355. There is also shown a noise level signal 357.

The speech decoder 301 may comprise suitable circuitry, logic, and/or code that may be operable to decode a received speech signal and generate an output signal that may be further processed and played back by an output device, such as the speaker 353, for example.

The DC remover 303 may comprise suitable circuitry, logic, and/or code that may be operable to remove the DC portion of a received signal from the speech decoder 301. The DL DRC 305 may comprise suitable circuitry, logic, and/or code that may be operable to control the dynamic range of a received audio signal. In this manner, distortion may be reduced at high volume situations, such as when a cell phone user may utilize a speaker phone mode with a high volume setting, for example.

The speech encoder 307 may comprise suitable circuitry, logic, and/or code that may be operable to encode a received speech signal for subsequent processing and transmission, for example. The received signal may be generated by an input device, such as the microphone 355, for example.

The mute control module 309 may comprise suitable circuitry, logic, and/or code that may be operable to mute a received audio signal. In this manner, a wireless device such as a mobile phone, may playback a received audio signal via a speaker, but not transmit another received signal, such as from a microphone.

The upload DRC 311 may comprise suitable circuitry, logic, and/or code that may be operable to control the dynamic range of a received audio signal. In this manner, distortion may be reduced at high volume situations, such as when a cell phone user may utilize a speaker phone mode with a high volume setting, or be in a high noise environment, for example.

The synthesizer/filter module 313 may comprise suitable circuitry, logic, and/or code that may be operable to generate noise cancellation signals and filter unwanted signals. The filtering capability in the synthesizer/filter module 313 may comprise a high pass filter, for example.

The subband NLP 315 may comprise suitable circuitry, logic, and/or code that may be operable to suppress residual echo. The subband NLP may receive as inputs, the noise level signal 357 and signals generated by the DL subband analysis module 319 and the UL subband analysis module 321. The subband NLP output may be communicatively coupled to the NS/CNG module 317.

The NS/CNG module 317 may comprise suitable circuitry, logic, and/or code that may be operable to suppress noise and/or generate a comfort noise signal, which may indicate to a mobile device user that the person on the other end of the call is still present, as opposed to complete silence.

The DL subband analysis module 319 may comprise suitable circuitry, logic, and/or code that may be operable to suppress residual echo. The input of the DL subband analysis module 319 may be communicatively coupled to the output of the DL DRC module 305, and may analyze the non-linear characteristics of the received signal, which may be received by the wireless system 150, described with respect to FIG. 1.

The UL subband analysis module 321 may comprise suitable circuitry, logic, and/or code that may be operable to suppress residual echo in an upload signal, such as one generated by the microphone 355. The input of the UL subband analysis module 321 may be communicatively coupled to the output of the dual EC 323. The output of the UL subband analysis module 321 may be communicatively coupled to the NS/CNG module 317 and the subband NLP module 315.

The dual EC 323 may comprise suitable circuitry, logic, and/or code that may be operable to cancel echoes in audio signals. The inputs of the dual EC 323 may be communicatively coupled to the DC remover 331 and the output of the DL DRC 305. The output of the dual EC 323 may be communicatively coupled to the UL subband analysis module 321.

The adder 325 may comprise suitable circuitry, logic, and/or code that may be operable to receive a plurality of input signals and generate an output signal that may be the sum of the input signals. The inputs of the adder 325 may be communicatively coupled to the DL DRC module 305 and the side tone expander module 327. The output of the adder 325 may be communicatively coupled to the switch 333A.

The side tone expander module 327 may comprise suitable circuitry, logic, and/or code that may be operable to amplify audio signals in a desired frequency range and attenuate signals in another frequency band. In this manner, the amplitude of desired signals may be selectively amplified while decreasing the magnitude of other signals.

The side tone filter/gain module 329 may comprise suitable circuitry, logic, and/or code that may be operable to shape the side tone frequency that may be generated by the UL signal at the output of the DC remover 331. The output of the side tone filter/gain module 329 may be communicatively coupled to the side tone expander module 327.

The DC remover 331 may be substantially similar to the DC remover 303, but may be operable to remove DC signals from a Tx signal generated by the microphone 355 and/or the BT Rx 351, for example.

The switch 333A may comprise suitable circuitry, logic, and/or code that may be operable to switch between a DL signal generated by the adder 325 for communication to the Rx CODEC 337 or the BT filter 335A. Similarly, the switch 333B may comprise suitable circuitry, logic, and/or code that may be operable to switch between the Tx CODEC 343 and the BT filter 335B, and communicate the desired signal to the DC remover 331.

The BT filters 335A and 335B may comprise suitable circuitry, logic, and/or code that may be operable to filter out undesired signals and allow desired BT signals to pass. The BT filter 335A may be communicatively coupled to the adder 325, in instances where the switch 333A is switched to the BT filter 335A. The output of the BT filter 335A may be communicatively coupled to the BT Tx 349. The input of the BT filter 335B may be communicatively coupled to the BT Rx 351, and the output may be communicatively coupled to the switch 333B.

The Rx CODEC 337 may comprise suitable circuitry, logic, and/or code that may be operable to process received audio signals for communication to an output device, such as the speaker 353. The Rx CODEC 337 may comprise the Rx filter 339 and the PGA/processing module 341. The Rx filter 339 may comprise suitable circuitry, logic, and/or code that may be operable to filter out undesired signals while allowing a desired audio signal to be communicated to the PGA/processing module 341. The Rx filter 339 may comprise digital infinite impulse response (IIR) filters, such as biquads, for example. The PGA/processing module 341 may comprise suitable circuitry, logic, and/or code that may be operable to amplify a received audio signal as well as perform other audio processing tasks for enhancing the desired audio signal quality.

The Tx CODEC 343 may comprise suitable circuitry, logic, and/or code that may be operable to process received audio signals received from an input device, such as the microphone 355. The Tx CODEC 343 may comprise the Tx filter 345 may comprise suitable circuitry, logic, and/or code that may be operable to filter undesired signals while allowing desired signals received from the PGA/processing module 347 to pass. The Tx filter 345 may comprise digital infinite impulse response (IIR) filters, such as biquads, for example. In an embodiment of the invention, the Rx CODEC 337 and the Tx CODEC 343 may be integrated in a hardware block, such as the digital audio processing module 211, described with respect to FIG. 2.

The PGA/processing module 347 may comprise suitable circuitry, logic, and/or code that may be operable to amplify a signal received from the microphone 355 as well as to perform other audio processing tasks for the desired audio signal quality.

The BT Tx 349 may comprise suitable circuitry, logic, and/or code that may be operable to wirelessly transmit a BT signal to a BT device, such as a BT headset, for example. The input of the BT Tx 349 may be communicatively coupled to the output of the BT filter 335A. The BT Rx 351 may comprise suitable circuitry, logic, and/or code that may be operable to receive a BT signal from a BT device, such as a BT headset, for example.

The speaker 353 may comprise suitable circuitry, logic, and/or code that may be operable to generate and output an audio signal from an electrical signal received from the Rx CODEC 337. The microphone 355 may comprise suitable circuitry, logic, and/or code that may be operable to generate an electrical signal from a received audio signal, and communicate the generated electrical signal to the Tx CODEC 343 for processing, for example.

In operation, in the DL path, a speech signal from the speech decoder 301 may pass through the DC remover 303 followed by the DL DRC 305. The DL DRC 305 may perform pre-emphasis, gain control, expansion and compression to increase subjective loudness, to reduce background noise and to prevent speaker overload. The output of the DL DRC 305 may be communicated to the Rx CODEC 337 via the switch 333A. The RX CODEC 337 may comprise digital IIR filter to compensate for the response of the speaker 353. The Rx CODEC 337 may also comprise digital & analog gain stages, delta-to-sigma DAC, power amplifier, and analog filters, for example.

For the UL path, the Tx CODEC 343 may also comprise digital IIR filters, such as biquads, for example, to compensate for the microphone 355 response. The Tx CODEC 343 may also comprise gain stages, a sigma-to-delta ADC, and a power amplifier, for example. A speech signal from the Tx CODEC 343 may be communicated to a high pass filter to remove DC, the DC remover 331. The output from the DC remover 331 may be utilized by the side tone filter/gain module 329 to generate a side tone. In this manner, the side tone frequency may be shaped or otherwise processed using side tone filtering and gain. The signal generated by the Tx CODEC 343 may contain acoustic coupled echo, local UL speech signal, and noise. The dual EC may then be utilized to reduce acoustic echo. Due to nonlinearity, residual echo usually may still be present after the dual EC 323. The following modules, such as the UL subband analysis module 321, the DL subband analysis module 319, the subband NLP 315, the NS/CNG module 317, and the synthesis/filter module 313, may suppress residual echo using subband non-linear processing. The suppressed echo may be further masked by comfort noise generated by the NS/CNG module 317. The background noise may also be suppressed using the subband noise suppressor in the NS/CNG module 317. The signal may then be communicated to the synthesis/filter module 313 followed by the UL DRC 311 for dynamic range control. The signal may then be processed by the mute control module 309 which may mute the signal when selected by the user, for example, followed by the speech encoder 307 which may encode the speech signal before subsequent processing and transmission, for example.

Figure 4:
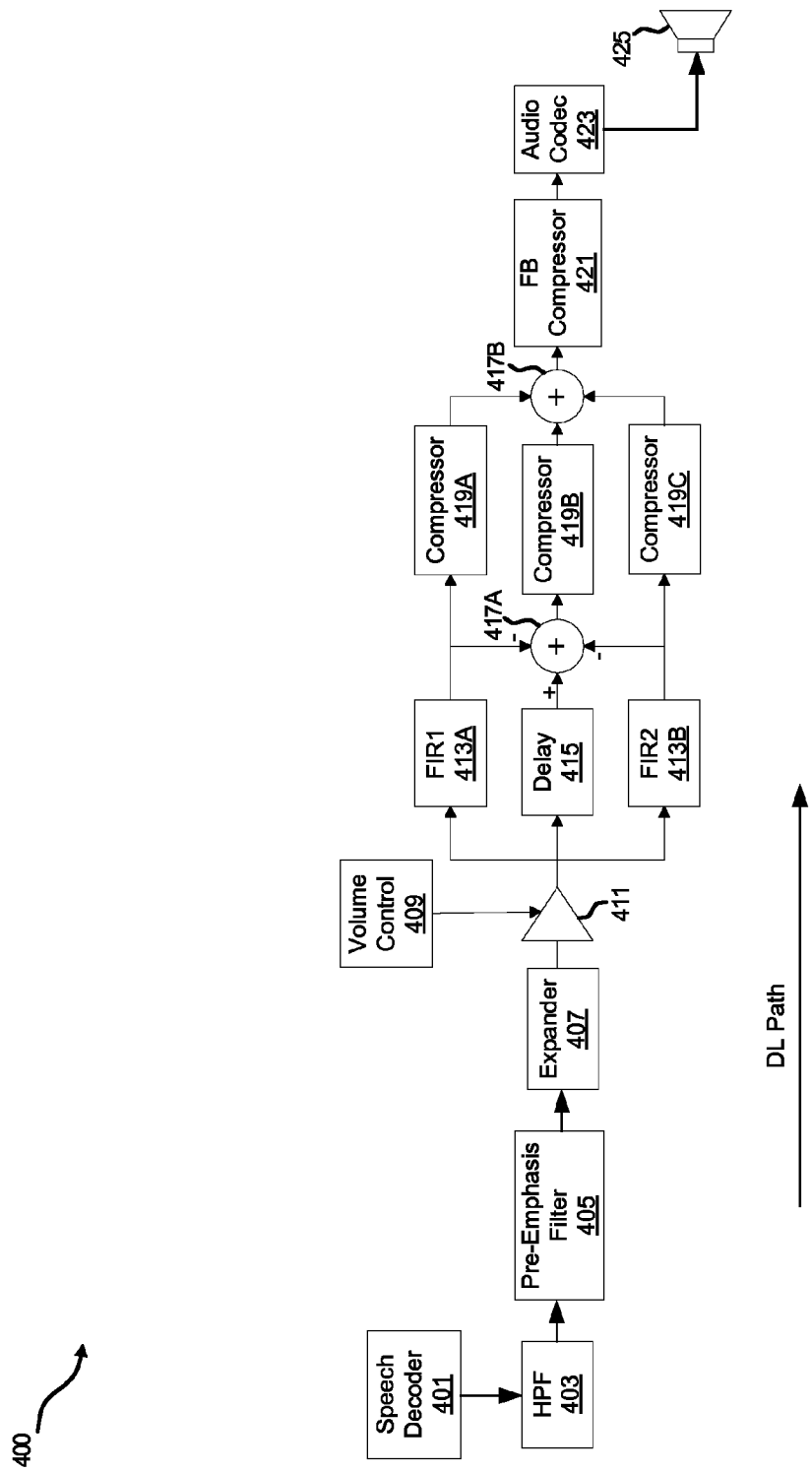
FIG. 4 is a module diagram illustrating exemplary dynamic range control architecture, in accordance with an embodiment of the invention.

FIG. 4 is a module diagram illustrating exemplary dynamic range control architecture, in accordance with an embodiment of the invention. Referring to FIG. 4, there is shown a DRC architecture 400 comprising a speech encoder 401, a high-pass filter (HPF) 403, a pre-emphasis filter 405, an expander 407, a volume control module 409, a gain module 411, finite impulse response (FIR) filters 413A and 413B, a delay module 415, adders 417A and 417B, compressor 419A-419C, a full-band (FB) compressor 421, an audio CODEC 423, and a speaker 425.

The speech decoder 401, the HPF 403, the adders 417A and 417B, the audio CODEC 423, and the speaker 425 may be substantially similar to the speech decoder 301, the DC remover 303, the adder 325, the Rx CODEC 337, and the speaker 353.

The pre-emphasis filter 405 may comprise suitable circuitry, logic, and/or code that may be operable to shape the frequency response in the DL path. Utilizing the pre-emphasis filter 405 may result in frequency dependent compression, such that the more the high frequencies are boosted, the more they are compressed. The pre-emphasis filter 405 may comprise a plurality of biquad IIR filters, where the transfer function may be defined as follows:

$$H(z) = \frac{b_0 + b_1 z^{-1} + b_2 z^{-2}}{1 + a_1 z^{-1} + a_2 z^{-2}}$$

The expander 407 may comprise suitable circuitry, logic, and/or code that may be operable to adjust a gain value based on the magnitude of a received signal.

The volume control module 409 may comprise suitable circuitry, logic, and/or code that may be operable to adjust the gain of the gain module 411. The gain module 411 may comprise suitable circuitry, logic, and/or code that may be operable to receive an input signal and generate an output signal at a magnitude that is increased or decreased by the gain factor of the gain module 411. The output of the gain module 411 may be communicatively coupled to the inputs of the filters FIR1 413A and FIR2 413B, and the delay module 415.

The filters FIR1 413A and FIR 2 413B may comprise suitable circuitry, logic, and/or code that may be operable to attenuate signals outside of a desired frequency band and allow signals to pass within a desired band. The delay module 415 may comprise suitable circuitry, logic, and/or code that may be operable to delay a received input signal.

The output of the FIR1 413A may be communicatively coupled to the input of the compressor 419A and the adder 417A. Similarly, the output of the FIR2 413B may be communicatively coupled to the input of the compressor 419C and the adder 417A. The output of the delay module 415 may be communicatively coupled to the adder 417, the output of which may be communicatively coupled to the compressor 419B. In this manner, the three modules, the filters FIR1 413A and FIR2 413B, and the delay module 415 may enable three-band processing and/or compression of a received signal.

The compressors 419A-419C may comprise suitable circuitry, logic, and/or code that may be operable to attenuate signals in a frequency band of high signal level while maintaining signals in frequency bands of lower signal level. In this manner, hard and soft clipping may be reduced and/or eliminated in an audio signal. Although FIG. 4 shows a three-band compressor, utilizing the compressors 419A-419C, the invention is not so limited. Accordingly, any number of frequency bands may be utilized depending on the desired complexity of the dynamic range control, for example. The compressors 419A-419C may comprise sub-band compressors. In an exemplary embodiment of the invention, the compressors in the DRC 400 may comprise infinite slope compressors.

The FB compressor 421 may comprise suitable circuitry, logic, and/or code that may be operable to attenuate signals in a frequency band of high signal level while maintaining signals in frequency bands of lower signal level. In this manner, hard and soft clipping may be reduced and/or eliminated in an audio signal. In an exemplary embodiment of the invention, the FB compressor 421 may be enabled to compress signals over a wider frequency band as compared to the compressors 419A-419C.

In operation, a speech signal from the speech decoder 401 may pass through the HPF 403 to remove the DC component of the signal, followed by the pre-emphasis filter 405. The signal may then be subject to expansion via the expander 407, gain via the gain module 411 and the volume control module 409, followed by the three-band compression via the compressors 419A-419C to increase subjective loudness. This may, for example, reduce background noise and mitigate or eliminate speaker overload.

For increased effective loudness, instead of increasing the gain, which may cause hard and/or soft clipping, overload the loudspeaker and cause nonlinear distortion, syllabic compression may be used to maintain the gain for nominal and low signal levels and to compress high level signals. Furthermore, since a loudspeaker may be more sensitive to low frequency overload, the signal may be split into low, medium, and high frequency bands. This enables varying levels of compression to be applied to different frequency bands. For example, more compression may be applied in the low frequency band to protect loudspeaker overload and/or less or no compression may be applied to high frequency bands. In an exemplary embodiment of the invention, an equal loudness curve, which may be unique to a user, may be utilized to configure the compression characteristics.

The output of the FB compressor 421 may be communicated to the audio CODEC 423. The audio CODEC 423 may comprise a digital IIR filter to compensate for the speaker 425 response. The audio CODEC 423 may also comprise digital & analog gain stages, delta-to-sigma DAC, power amplifier, and analog filters, for example. The audio CODEC 423 may communicate an audio signal to the speaker 425, which may generate an audible signal. In an embodiment of the invention, the audio CODEC 423 may be integrated in a hardware block, such as the digital audio processing module 211, described with respect to FIG. 2.

Figure 5A:
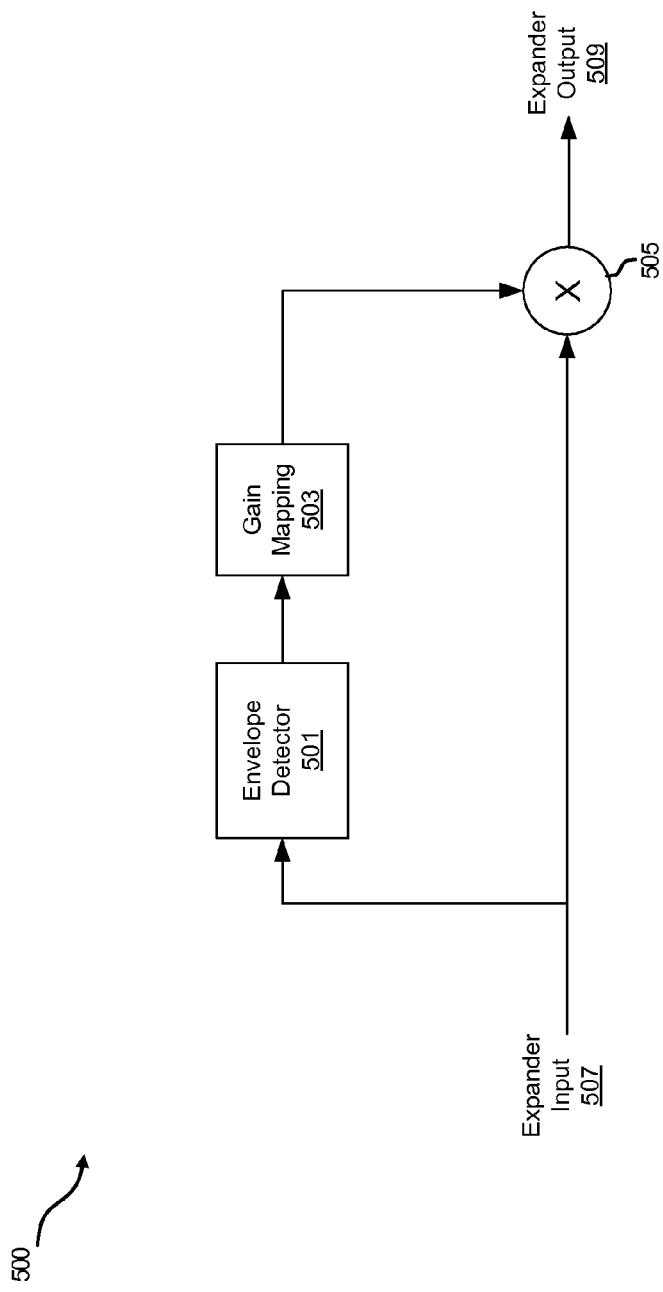
FIG. 5A is a module diagram illustrating an exemplary expander, in accordance with an embodiment of the invention.

FIG. 5A is a module diagram illustrating an exemplary expander, in accordance with an embodiment of the invention. Referring to FIG. 5A, there is shown an expander 500 comprising an envelope detector 501, a gain mapping module 503, and a multiplier 505. There is also shown an expander input signal 507 and an expander output signal 509.

The envelope detector 501 may comprise suitable circuitry, logic, and/or code that may be operable to sense the magnitude of the expander input signal 507. In an exemplary embodiment of the invention, the envelope detector 501 may comprise a diode, and may estimate the speech signal level with a desired time constant for attack and decay, on the order of tens of milliseconds, for example. In this manner, the envelope detector 501 may track the speech syllable amplitude instead of the instant amplitude, which may prevent too rapid a change of the expander 500 gain.

The gain mapping module 503 may comprise suitable circuitry, logic, and/or code that may be operable to determine the desired gain level to apply to the expander input signal 507 via the multiplier 505. The output of the gain mapping module 503 may be communicatively coupled to the multiplier 505.

The multiplier 505 may comprise suitable circuitry, logic, and/or code that may be operable to multiply the expander input signal 507 by a gain factor determined by the gain mapping module 503. The resulting multiplied signal may comprise the expander output signal 509.

In operation, the magnitude of the received expander input signal 507 may be determined utilizing the envelope detector 501. The gain mapping module may be operable to determine the desired gain factor to be applied to the expander input signal 507, and communicate the desired gain level to the multiplier 505. The multiplier 505 may multiply the expander input signal 507 by the gain factor to generate the expander output signal 509.

For background noise, where the signal level may be low, the expander 500 may operate in a low gain, or attenuation mode, such that the noise may be reduced. In instances where the expander input signal 507 may be higher, indicating a voice signal, the attenuation may be decreased or eliminated.

Figure 5B:
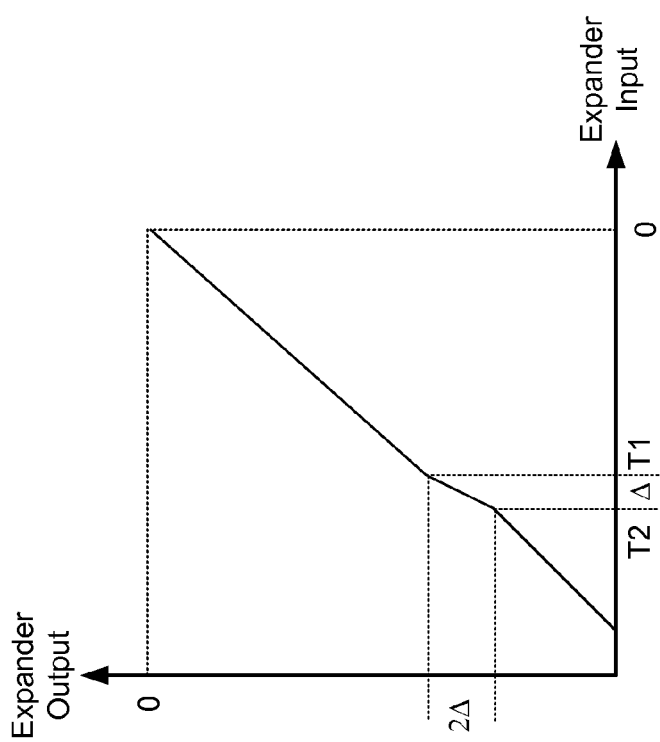
FIG. 5B is a plot of exemplary expander characteristics, in accordance with an embodiment of the invention.

FIG. 5B is a plot of exemplary expander characteristics, in accordance with an embodiment of the invention. Referring to FIG. 5B, there is shown an expander output plot 520 representing the expander output gain versus the input signal. The expander thresholds, T1 and T2, may be fixed, but may also be configurable, or adaptive. T1 and T2 may be configured to adjust the expansion range according to the background noise level. In instances where the background noise is strong, a far-end talker tends to increase the talk level. Thus, the expander 500 thresholds T1 and T2 may be increased to reduce strong background noise. Similarly, in instances where the far-end talker is in a quiet environment, the expander 500 thresholds T1 and T2 may be reduced to reduce pumping noise, which may otherwise occur when a voice or audio signal may be near the thresholds T1 and T2 and where the thresholds may be held constant.

Figure 6:
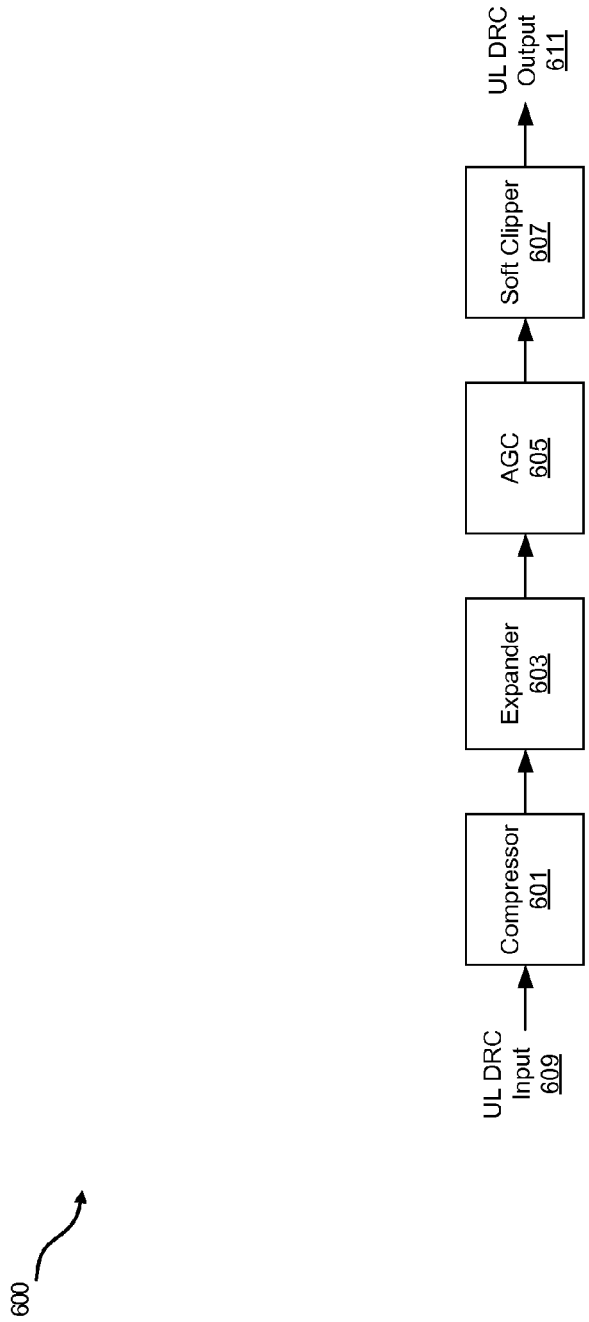
FIG. 6 is a module diagram of an exemplary upload dynamic range controller, in accordance with an embodiment of the invention.

FIG. 6 is a module diagram of an exemplary upload dynamic range controller, in accordance with an embodiment of the invention. Referring to FIG. 6, there is shown an UL DRC 600 comprising a compressor 601, an expander 603, an adjustable gain control (AGC) 605, and a soft clipper 607. There is also shown a DRC input signal 609 and a DRC output signal 611.

The compressor 601 may comprise suitable circuitry, logic, and/or code that may be operable to attenuate signals in a frequency band of high signal level while maintaining signals in frequency bands of lower signal level. In this manner, hard and soft clipping may be reduced and/or eliminated in an audio signal. The gain mapping for the compressor 601 may comprise a plurality of gain levels for different DRC input signal 609 levels. For example, the gain may be low for high and low input levels, and higher for mid-range input levels.

The expander 603 may comprise suitable circuitry, logic, and/or code that may be operable to adjust a gain value based on the magnitude of a received signal, as described with respect to FIG. 5A.

The AGC 605 may comprise suitable circuitry, logic, and/or code that may be operable to receive an input signal and generate an output signal at a desired signal level. The soft clipper 607 may comprise suitable circuitry, logic, and/or code that may be operable to receive an input signal and generate an output signal with a reduced magnitude in instances where the magnitude of the input signal approaches a maximum desired signal.

In operation, the UL DRC input signal 609 may be received by the compressor 601 which may generate an output signal with reduced large magnitude signals and unchanged smaller magnitude signals. The output of the compressor 601 may be communicated to the expander 603, which may reduce small magnitude signals more than larger signals, which may then be communicated to the AGC 605 which may apply a configurable gain to the received signal. The amplified signal may be communicated to the soft clipper 607, which may limit the highest magnitude signals to avoid clipping thus generating the UL DRC output signal 611.

Figure 7:
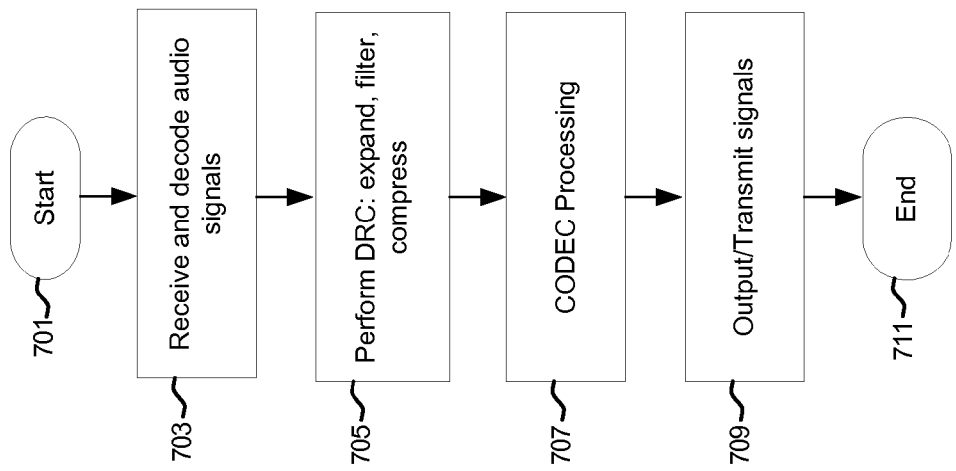
FIG. 7 is a module diagram illustrating exemplary steps in dynamic range control in an audio processing system, in accordance with an embodiment of the invention.

FIG. 7 is a module diagram illustrating exemplary steps in dynamic range control in an audio processing system, in accordance with an embodiment of the invention. In step 703, after start step 701, audio signals may be received and decoded. In step 705, dynamic range control may be performed comprising expansion, multi-band filtering, and compression. In step 707, the signals may be processed by an audio CODEC before step 709 where the processed signals may be output, by a speaker, for example, or may be transmitted, followed by end step 711.

In an exemplary embodiment of the invention, a method and system is disclosed for controlling a dynamic range of an audio signal by expanding the dynamic range utilizing a dynamic expander 407/500, and dividing the audio signal into a plurality of frequency bands. Each of the frequency bands may be individually compressed utilizing a multi-band compressor 419A-419C. A sum of the individually compressed frequency bands may be compressed utilizing a full-band compressor 421. The audio signal may be filtered utilizing a pre-emphasis filter 405, such as an infinite impulse response filter. The audio signal may be divided into a plurality of frequency bands utilizing one or more finite impulse response filters 413A and 413B and/or delay modules 415. The dynamic expander 407/500 may comprise adaptive thresholds and an envelope detector 501. Each of the plurality of frequency bands may be compressed utilizing syllabic compression in the multi-band compressor 419A-419C. The compressed sum of individually compressed plurality of frequency bands may be processed utilizing an audio CODEC 423. The multi-band compressor 419A-419C may comprise a plurality of sub-band compressors.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for dynamic range control in an audio processing system.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic module, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising:
    expanding a dynamic range of an audio signal:
    delaying said expanded audio signal into a delayed audio signal;
    dividing said expanded audio signal into a plurality of frequency bands;
    combining the delayed audio signal and the plurality of frequency bands into a combined audio signal;
    individually compressing each of said plurality of frequency bands and said combined audio signal; and
    compressing a sum of said individually compressed plurality of frequency bands and said combined audio signal.

2. The method according to claim 1, further comprising pre-emphasis filtering said audio signal.

3. The method according to claim 2, wherein said pre-emphasis filtering comprises infinite impulse response filtering said audio signal.

4. The method according to claim 1, further comprising finite impulse response filtering said expanded audio signal to enable said dividing of said expanded audio signal into said plurality of frequency bands.

5. The method according to claim 1, wherein said compressing each of said plurality of frequency bands comprises:
    utilizing syllabic compression.

6. The method according to claim 1, wherein said expanding said dynamic range of said audio signal comprises:
    utilizing a dynamic expander in a hardware audio CODEC.

7. The method according to claim 1, wherein said expanding said dynamic range of said audio signal comprises:
    utilizing a dynamic expander in a processor.

8. The method according to claim 6, wherein said dynamic expander comprises adaptive thresholds.

9. The method according to claim 6, wherein said dynamic expander comprises an envelope detector.

10. The method according to claim 1, wherein said individually compressing each of said plurality of frequency bands comprises:
    utilizing a multi-band compressor in a hardware audio CODEC.

11. The method according to claim 9, wherein said multi-band compressor comprises a plurality of sub-band compressors.

12. The method according to claim 1, wherein said compressing said summed individually compressed frequency bands comprises:
    utilizing a full-band compressor in a hardware audio CODEC.

13. A system for processing audio signals, the system comprising:
    an expander configured to expand a dynamic range of an audio signal;
    a delay circuit configured to delay said expanded audio signal into a delayed audio signal;
    a plurality of filters configured to divide said expanded audio signal into a plurality of frequency bands;
    a combiner configured to combine the delayed audio signal and the plurality of frequency bands into a combined audio signal;
    a plurality of frequency compressors configured to individually compress each of said plurality of frequency bands and said combined audio signal;
    an adder configured to add the plurality of individually compressed frequency bands; and
    a compressor configured to compress the sum of said individually compressed plurality of frequency bands and said combined audio signal.

14. The system according to claim 13, further comprising:
    a pre-emphasis filter configured to filter said audio signal utilizing pre-emphasis filtering.

15. The system according to claim 14, wherein said pre-emphasis filter is further configured to perform infinite impulse response filtering for said pre-emphasis filtering.

16. The system according to claim 13, wherein said plurality of filters are further configured to perform finite impulse response filtering for said division of said expanded audio signal into said plurality of frequency bands.

17. The system according to claim 13, further comprising:
    a delay module configured to delay said expanded audio signal for said adding to said plurality of individually compressed frequency bands.

18. The system according to claim 13, wherein said plurality of frequency compressors is further configured to perform syllabic compression for said compressing of said each of said plurality of frequency bands.

19. The system according to claim 13, wherein said expander comprises a dynamic expander in a hardware audio CODEC configured to perform said dynamic expansion of said dynamic range of said audio signal.

20. The system according to claim 13, wherein said expander comprises a processor configured to perform dynamic expansion of said dynamic range of said audio signal.

21. The system according to claim 19, wherein said dynamic expander comprises adaptive thresholds.

22. The system according to claim 19, wherein said dynamic expander comprises an envelope detector.

23. The system according to claim 13, wherein said plurality of frequency compressors comprise a multi-band compressor in a hardware audio CODEC configured to perform said individual compression of each of said plurality of frequency bands.

24. The system according to claim 23, wherein said multi-band compressor comprises a plurality of sub-band compressors.

25. The system according to claim 13, wherein said compressor comprises a full-band compressor in a hardware audio CODEC configured to perform said compression of said summed individually compressed frequency bands.

\* \* \* \* \*